United States Patent
Chen et al.

(10) Patent No.: US 12,133,477 B2
(45) Date of Patent: Oct. 29, 2024

(54) RESISTIVE RANDOM ACCESS MEMORY AND METHOD FOR OPERATING SAME

(71) Applicant: HEFEI RELIANCE MEMORY LIMITED, Hefei (CN)

(72) Inventors: Zezhi Chen, Hefei (CN); Zhichao Lu, San Jose, CA (US); Liang Zhao, Sunnyvale, CA (US)

(73) Assignee: Hefei Reliance Memory Limited, Hefei (CN)

( * ) Notice: Subject to any disclaimer, the term of this patent is extended or adjusted under 35 U.S.C. 154(b) by 138 days.

(21) Appl. No.: 17/873,594

(22) Filed: Jul. 26, 2022

(65) Prior Publication Data
US 2023/0028701 A1    Jan. 26, 2023

(30) Foreign Application Priority Data

Jul. 26, 2021  (CN) .......................... 202110843855.0

(51) Int. Cl.
*G11C 13/00* (2006.01)
*H10N 70/00* (2023.01)
*H10N 70/20* (2023.01)

(52) U.S. Cl.
CPC ....... *H10N 70/245* (2023.02); *G11C 13/0007* (2013.01); *G11C 13/0011* (2013.01); *H10N 70/826* (2023.02); *H10N 70/883* (2023.02)

(58) Field of Classification Search
CPC .. H10N 70/24; H10N 70/8833; H10N 70/841; H10N 70/826; H10N 70/021; H10N 70/883; H10N 70/011; H10N 70/801; H10N 70/245; H10N 70/041; H10N 70/20; H10N 70/8416; H10N 70/063; H10N 70/028; H10N 70/828; H10N 70/8825; H10N 70/023; H10N 70/823; H10N 70/066; H10N 70/043; H10N 70/8413; H10N 70/881; H10N 70/8822; H10N 70/884; H10N 70/026; H10N 70/00; H10N 70/046; H10N 70/821; H10N 70/8836; H10N 70/8845; G11C 13/0007; G11C 13/0069; G11C 13/0011; G11C 13/003; G11C 13/004; G11C 2213/52; G11C 2213/15; G11C 2213/51; G11C 2213/77; G11C 2213/32; G11C 7/12; G11C 13/0004; G11C 13/0097; G11C 2213/71; G11C 2213/55; G11C 2013/0073; G11C 2013/0083; G11C 2013/005; G11C 2013/0078; G11C 2013/009; G11C 2213/50; G11C 2213/79;
(Continued)

(56) References Cited

FOREIGN PATENT DOCUMENTS

WO    WO-2018004574 A1 *  1/2018

* cited by examiner

*Primary Examiner* — Thong Q Le
(74) *Attorney, Agent, or Firm* — Sheppard Mullin Richter & Hampton LLP

(57) ABSTRACT

A resistive random access memory (RRAM) and a method for operating the RRAM are disclosed. The RRAM includes at least two successively stacked conductive layers and a resistive switching layer situated between every adjacent two conductive layers, wherein a migration interface with an interface effect is formed at each interface between one conductive layer and the resistive switching layer in contact therewith, wherein the migration interface regulates, by the interface effect, vacancies formed in the resistive switching layer under the effect of an electrical signal. The regulation includes at least one of absorption, migration and diffusion.

16 Claims, 5 Drawing Sheets

(58) Field of Classification Search
CPC ........ G11C 2013/0045; G11C 2213/11; G11C 2213/78; G11C 11/5685; G11C 13/0038; G11C 13/04; G11C 2213/34; G11C 11/21; G11C 17/165; G11C 2213/56
USPC .......................................................... 365/148
See application file for complete search history.

RESISTIVE RANDOM ACCESS MEMORY AND METHOD FOR OPERATING SAME

CROSS-REFERENCE TO RELATED APPLICATION

This application claims the benefit of Chinese Application No. 202110843855.0, filed with the China National Intellectual Property Administration on Jul. 26, 2021 and entitled "RESISTIVE RANDOM ACCESS MEMORY AND METHOD FOR OPERATING SAME." The above-referenced application is hereby incorporated by reference herein in its entirety for all purposes.

TECHNICAL FIELD

The present invention relates to the field of memory technology and, in particular, to a resistive random access memory (RRAM) and a method for operating the RRAM.

BACKGROUND

With conventional non-volatile memory (e.g., NAND, NOR) devices becoming difficult to meet the requirements on device miniaturization and low power consumption, new memory represented by resistive random access memory (RRAM) is widely regarded as promising next generation non-volatile memory.

RRAM is a two-terminal sandwich structure consisting of three components: a top conductive layer, a resistive switching layer, and a bottom conductive layer. The resistive switching layer is typically a film of a dielectric material. When this two-terminal sandwich structure is under the effect of an external electrical signal such as a current or voltage, the resistive switching layer will switch between two or more resistance states. By virtue of such resistance state switching, data or a program can be represented by and stored as appropriate resistance states.

When under the effect of an electrical signal, the resistive switching layer will experience a change in physical and chemical properties. It is generally believed that aggregated metal cation vacancies or oxygen anion vacancies will be formed at the surface of or inside the resistive switching layer and remain to a certain extent even after the electrical signal is removed. Such metal cation vacancies or oxygen anion vacancies generally lower the resistance of the dielectric film. Taking advantage of this property, the resistance state of the resistive switching layer can be changed through manipulating the electrical signal (e.g., its type, magnitude, direction).

Some problems requiring urgent solution by those skilled in the art are how to improve controllable migration of vacancies in RRAM under the effect of an electrical signal and maintain the condition of the vacancies (including the number and aggregation status of them) after the electrical signal is removed, i.e., how to enhance their reliability. Otherwise, it will be difficult to further raise RRAM performance.

SUMMARY OF THE INVENTION

Embodiments of the present invention provide an RRAM with improved capabilities of controllable migration of vacancies under the effect of an electrical signal and of maintaining the condition of the vacancies after the electrical signal is removed, and a method for operating the RRAM, which break through the conventional technical principles.

In order to achieve the above and other related goals, the present invention provides a resistive random access memory (RRAM), comprising at least two successively stacked conductive layers and a resistive switching layer situated between every adjacent two conductive layers, wherein a migration interface with an interface effect is formed at each interface between one conductive layer and the resistive switching layer in contact therewith, wherein the migration interface regulates, by the interface effect, vacancies formed in the resistive switching layer under an effect of an electrical signal, and wherein the regulation comprises at least one of absorption, migration and diffusion.

In some embodiments, in the RRAM, the conductive layer may be formed of a material comprising one of a single-phase conductive material and a composite conductive material.

In some embodiments, in the RRAM, the material of the conductive layer may comprise a sub-stoichiometric conductive material.

In some embodiments, in the RRAM, the material of the conductive layer may comprise one of a sub-stoichiometric metal oxide, a sub-stoichiometric metal nitride, a sub-stoichiometric metal sulfide, a sub-stoichiometric metal phosphatide, a sub-stoichiometric metal selenide, a sub-stoichiometric metal arsenide, a sub-stoichiometric metal telluride and a sub-stoichiometric antimonide, or a combination thereof.

In some embodiments, in the RRAM, the conductive layers in contact with opposite sides of the resistive switching layer may be formed of different materials so that the migration interfaces formed on the opposite sides of the resistive switching layer have different interface effects.

In some embodiments, in the RRAM, the resistive switching layer may be formed of a material comprising at least one of a binary metal oxide and a multinary metal oxide.

In some embodiments, in the RRAM, the material of the resistive switching layer may comprise one of $HfO_2$, $Ta_2O_5$, $TiO_2$, $ZrO_2$, $Al_2O_3$, $WO_3$, $NiO$ and $Pr_{1-x}Ca_xMnO_3$, or a combination thereof.

In some embodiments, in the RRAM, the resistive switching layer may have a thickness of from 0.5 nm to 20 nm.

In some embodiments, the RRAM may be an oxygen-anion-based resistive random access memory and the vacancies in the resistive switching layer are oxygen anion vacancies. Alternatively, it may be a metal-cation-based resistive random access memory and the vacancies in the resistive switching layer are metal cation vacancies.

In order to achieve the above and other related goals, the present invention also provides a method for operating the resistive random access memory as defined above, comprising the steps of:

applying a first electrical signal to the resistive switching layer to increase or to aggregate vacancies; and performing at least one cycle to regulate the vacancies, wherein each cycle comprises:

applying a second electrical signal to the resistive switching layer to increase or to re-aggregate the vacancies in the resistive switching layer, thereby allowing a formation or an increase of conductive filament(s) in a local region of the resistive switching layer; and applying a third electrical signal to the resistive switching layer to reduce the vacancies, resulting in a break of the conductive filaments.

In some embodiments, in the method, when the migration interfaces formed on opposite sides of the resistive switching layer have different interface effects, the regulation of the vacancies may be accomplished by a synergistic action of the migration interfaces formed on the opposite sides of the resistive switching layer.

In some embodiments, in the method, the first electrical signal may be applied on a side of the resistive switching layer having a migration interface with a weaker interface effect.

In some embodiments, in the method, the first electrical signal may be applied on a side of the resistive switching layer having a migration interface with a stronger interface effect.

In some embodiments, in the method, the second electrical signal may be applied on a side of the resistive switching layer having a migration interface with the stronger interface effect.

In some embodiments, in the method, the third electrical signal may be applied on a side of the resistive switching layer having a migration interface with a weaker interface effect.

In some embodiments, in the method, when the second electrical signal is applied to the resistive switching layer, the vacancies may aggregate at the migration interfaces on opposite sides of the resistive switching layer, to cause a change in Schottky barriers between the conductive layers and the resistive switching layer, between which the migration interfaces are formed, thereby changing a resistance state in the resistive switching layer; wherein when the third electrical signal is applied to the resistive switching layer, the vacancies located at at least one of the migration interfaces on opposite sides of the resistive switching layer migrate and are filled, to cause another change in the Schottky barriers between the conductive layers and the resistive switching layer, between which the migration interfaces are formed.

In some embodiments, in the method, the second electrical signal is applied to enable the resistive switching layer to be at a low resistance state, wherein the third electrical signal is applied to enable the resistive switching layer to be at a high resistance state.

The present invention has the following beneficial effects over the prior art:

through providing, in the RRAM, a migration interface with an interface effect at an interface between one conductive layer and resistive switching layer in contact therewith, more stable and controllable migration of vacancies and more stable existence of the vacancies in the resistive switching layer can be achieved. Thus, the RRAM's ability of controllable migration of vacancies under the effect of an electrical signal and maintenance of the condition of the vacancies after the electrical signal is removed is enhanced in a manner not bound by the conventional technical principles.

BRIEF DESCRIPTION OF THE DRAWINGS

In FIGS. 1 through 6c,

Figure 1:
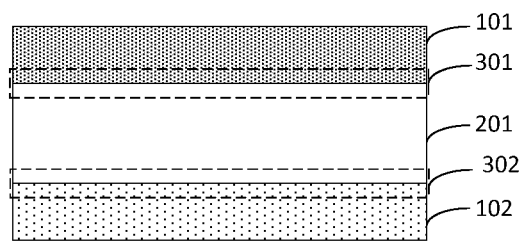
FIG. 1 is a schematic diagram showing the structure of an RRAM with two migration interfaces according to an embodiment of the present invention.

101: a first conductive layer; 102: a second conductive layer; 103: a third conductive layer; 201: a first resistive switching layer; 202: a second resistive switching layer; 301: a first migration interface; 302: a second migration interface; 303: a third migration interface; 304: a fourth migration interface; 401: oxygen anions; 402: metal cations; F1: a force exerted by an electrical signal; and F2: an interface effect.

DETAILED DESCRIPTION

When under the effect of an electrical signal, a resistive switching layer in an RRAM structure will experience a change in physical and chemical properties. It is generally believed that aggregated metal cation vacancies or oxygen anion vacancies will be formed at the surface of or inside the resistive switching layer and remain to a certain extent even after the electrical signal is removed. Such metal cation vacancies or oxygen anion vacancies generally lower the resistance of the dielectric material. Taking advantage of this property, the resistance state of the resistive switching layer can be changed through manipulating the electrical signal (e.g., its type, magnitude, direction).

The operating principles of an RRAM involve the following three basic patterns achieved by changing the resistance states through manipulating the electrical signal:

Electrical formation Immediately after an RRAM is made, as there are few vacancies in it, the device is in a very high resistance state. Under the effect of an electrical signal ramping to a critical level, vacancies will be increasingly formed and aggregate together. As a result, conductive filaments will be formed or aggregation of vacancies at a conductive interface will occur, resulting in a resistance drop.

Erase operation (reset process): This is believed to be a process where, under the effect of an electrical signal, conductive filaments resulting from aggregation of vacancies or a conductive interface will experience a reduction in the number of vacancies or a change in the aggregation status of the conductive interface, which leads to shrinkage or breakage of a conduction path and hence a resistance rise.

Write operation (set process): This is believed to be a process where, under the effect of an electrical signal, vacancies lost in an erase operation is regained and re-aggregate, resulting in a resistance decrease.

As can be seen from the operating principles of the RRAM, the main control task in RRAM operation involves controlling the electrical signal so as to achieve controllable migration of vacancies and the maintenance of their condition (including the number and aggregation status of them) after the electrical signal is removed.

For controllable migration of vacancies under the effect of an electrical signal:

It relies, on the one hand, on timely removal of the electrical signal after the success of the electrical formation and write and erase operations, which avoids over-aggregation or over-disaggregation caused by an overshoot of the applied electrical signal. This may lead to an excessively high operating current, causing significant discrepancies between different memory devices or even permanent breakdown.

On the other hand, it relies on the response of the RRAM itself to the electrical signal. For example, faster response of vacancies in the device to the electrical signal (i.e., easier migration of them under the effect of the electrical signal) is more prone to overshooting. However, slower response would require higher magnitude of the electrical signal. Therefore, a tradeoff is needed between these two factors.

In addition, for vacancy condition (including the number and aggregation status) maintenance after the electrical signal is removed, i.e., the reliability problem:

From the mechanistic point of view, this reliability problem, which directly affects memory performance, arises principally from spontaneous diffusion of vacancies due to concentration gradients at the operating ambient temperature, as well as from migration and diffusion of the vacancies under the action of slight disturbances in the electrical signal.

Therefore, existing RRAMs tend to be problematic in terms of controllable migration of vacancies under the effect of an electrical signal and the maintenance of the vacancies' condition (including their number and aggregation status) after the electrical signal is removed, i.e., the reliability problem. The lack of controllability of vacancies under the effect of an electrical signal is largely attributable to the fact that the migration of vacancies is always in a positive feedback relationship to the electrical signal and the migration of the vacancies lags behind variation of the electrical signal, which cause the occurrence of overshooting that may impair the device performance. After the electrical signal is removed, some vacancies remaining active tend to migrate or diffuse, leading to changes in the distribution of vacancies, which may affect the device's reliability.

There have been proposed some solutions for the above problems. For example, some of them attempt to control the incoming electrical signal from the point of view of circuit design. As another example, there are also some attempting to alter the device's physical and chemical properties from the point of view of process and material. From the mechanistic point of view, these solutions fail to break through the limitations of the technical principles on the device operation and performance.

In order to achieve controllable migration of vacancies under the effect of an electrical signal and maintenance of the condition of the vacancies after the electrical signal is removed, embodiments of the disclosed technology provide a RRAM design with multiple migration interfaces, and a method for operating and a device construction thereof, which break through the limitations of the conventional technical principles and entail an RRAM with effectively improved operating stability and reliability.

The disclosed RRAM and the method for operating thereof is described in greater detail with reference to the accompanying drawings and specific examples of embodiments. From the following description, advantages and features of the present invention will become more apparent. Note that the drawings are provided in a very simplified form, not necessarily drawn to exact scale, for the purpose of helping to explain the disclosed examples in a more convenient and clearer way.

The RRAM provided in the present invention includes at least two successively stacked conductive layers and a resistive switching layer situated between every adjacent two conductive layers, wherein a migration interface with an interface effect is formed at each interface between one conductive layer and the resistive switching layer in contact therewith, wherein the migration interface regulates, by the interface effect, vacancies formed in the resistive switching layer under an effect of an electrical signal, and wherein the regulation includes at least one of absorption, migration and diffusion.

The conductive layer can conduct electricity and can absorb, to a certain extent, vacancies formed in the resistive switching layer. The conductive layer is not limited to having any particular thickness, as long as the thickness is such that the physical and chemical properties of the conductive layer are invariable. The conductive layer is made of a material including a conductive material, and the material of the conductive layer may be either a single-phase or composite material. Additionally, the material of the conductive layer includes, but is not limited to, one of a conductive metal, a conductive metal oxide, a nitride (e.g., a metal nitride), a sulfide (e.g., a metal sulfide), a phosphatide (e.g., a metal phosphatide), a selenide (e.g., a metal selenide), an arsenide (e.g., a metal arsenide), a telluride (e.g., a metal telluride) or an antimonide, or a combination thereof. That is, the conductive materials include conductive metal materials and conductive compound materials. These conductive metal materials are instable and allow a migration interface with an interface effect to be formed when in contact with a resistive switching layer. The conductive compound materials include stoichiometric conductive materials and sub-stoichiometric conductive materials, such as stoichiometric metal nitrides and sub-stoichiometric metal nitrides.

In one embodiment, the material of the conductive layer is preferred to be a sub-stoichiometric conductive material. The materials of all the conductive layers may be sub-stoichiometric conductive materials. That is, the material of each conductive layer may be a sub-stoichiometric conductive material. Of course, it is also possible that the materials of some of the conductive layers are sub-stoichiometric conductive materials. For any resistive switching layer, if the materials of the conductive layers in contact therewith on opposite sides thereof are both sub-stoichiometric conductive materials, then at both the interfaces on opposite sides of the resistive switching layer, migration interfaces with interface effects will be formed, which can act synergistically to control absorption, migration and diffusion of vacancies. For this reason, in one embodiment, the materials of all the conductive layers are preferred to be sub-stoichiometric conductive materials. That is, the material of each conductive layer includes, but is not limited to, one of a sub-stoichiometric oxide (e.g., a sub-stoichiometric metal oxide), a sub-stoichiometric nitride (e.g., sub-stoichiometric metal nitride), a sub-stoichiometric sulfide (e.g., sub-stoichiometric metal sulfide), a sub-stoichiometric phosphatide (e.g., sub-stoichiometric metal phosphatide), a sub-stoichiometric selenide (e.g., sub-stoichiometric metal selenide), a sub-stoichiometric arsenide (e.g., sub-stoichiometric metal arsenide), a sub-stoichiometric telluride (e.g., sub-stoichiometric metal telluride) and a sub-stoichiometric antimonide, or a combination thereof. In other words, consistent with the concept of the present invention, in order to construct multiple migration interfaces, the RRAM is preferably composed of sub-stoichiometric conductive compounds (i.e., the sub-stoichiometric conductive materials) stacked above and under each dielectric film (i.e., resistive switching layer).

In the prior art, conductive layers are formed of stoichiometric conductive materials, which are stable and not easily changeable. Consequently, interfaces where the conductive layers come into contact with a resistive switching layer do not have interface effects. In contrast, the sub-stoichiometric conductive materials (i.e., sub-stoichiometric conductive compounds) of the conductive layers in the present embodiment are vacant of some cations or anions when compared to common stoichiometric conductive materials. This allows them to provide strong local electric fields and abundant dangling chemical bonds, which can chemically link to the material(s) of the resistive switching layer(s) when an appropriate process is used. The vacancy of some cations or anions leads to variations in the crystal structures of the materials and hence certain lattice matching with the resistive switching layer(s), which produces interface stress. Thus, the sub-stoichiometric conductive materials can form, with the resistive switching layer(s), a variety of adjustable interfaces for absorption, migration and diffusion of vacancies. i.e., the migration interfaces. Further, forming such interfaces for absorption, migration and diffusion of vacancies on opposite sides of each resistive switching layer, through providing the sub-stoichiometric conductive materials, can enable the interfaces to work as a synergistic pair to enhance stability and controllability of migration of the vacancies and their stability in the resistive switching layer.

Preferably, the conductive layers in contact with opposite sides of one resistive switching layer are formed of different materials so that the migration interfaces formed on the opposite sides of the resistive switching layer have different interface effects. Two or more different materials may be chosen for the conductive layers based on theoretical calculation or experimentation such that the migration interfaces formed by the conductive layers with the resistive switching layer(s) can enable migration, diffusion and absorption of vacancies produced in the resistive switching layer(s) under the effect of an electrical signal. When the migration interfaces formed on opposite sides of a resistive switching layer have different interface effects, better regulation of vacancies can be achieved by synergistic cooperation of the migration interfaces formed on opposite sides of a resistive switching layer. That is, by using the synergistic combination of the two interface effects to achieve absorption, migration and diffusion control of vacancies during electrical formation and erase and write operations can be achieved. Of course, the conductive layers in contact with opposite sides of the resistive switching layer may be formed of the same material. However, in this case, the absorption, migration and diffusion control of vacancies provided by the migration interfaces is subpar to that provided by migration interfaces formed between a resistive switching layer and conductive layers that are in contact with the resistive switching layer on opposite sides thereof and are formed of different materials.

In some embodiments, migration interfaces for absorption, migration and diffusion of vacancies are formed at the respective interfaces on opposite sides of each resistive switching layer in the RRAM. These migration interfaces on the opposite sides can cooperate synergistically to alter a feedback relationship between vacancy migration and an electrical signal and enable a stable distribution of vacancies after the electrical signal is removed. That is, this embodiment may form interfaces for migration and diffusion of vacancies above and under each resistive switching layer in the RRAM, which can act synergistically to alter a feedback relationship between vacancy migration and an electrical signal and enable a stable distribution of vacancies after the electrical signal is removed. Specifically, apart from external electrical signal and temperature, the absorption, migration and diffusion of vacancies also depend on interface effects including interface stress, chemical bonding, and local electric fields. These physical or chemical interface effects have some impact on vacancies. Through properly coordinating the effects of migration interfaces on opposite sides of a resistive switching layer on absorption, migration and diffusion of vacancies, when an electrical signal is applied, the positive feedback relationship between migration of vacancies and the electrical signal can be altered. For example, after a vacancy passes through one of the migration interfaces under the action of the electrical signal, if the other migration interface has an absorbing effect on the vacancy, migration and diffusion of the vacancy can be suppressed to a certain extent, thus helping avoid overshooting. Moreover, if both the migration interfaces on the opposite sides of the resistive switching layer have an absorbing effect on vacancies, then after the electrical signal is removed, the two migration interfaces will restrain the vacancies from diffusing toward either side, thus maintaining a stable distribution of the vacancies and hence enabling the device to have more reliable performance. Therefore, by exploiting the interface effects, controllable migration of vacancies in the RRAM under the effect of an electrical signal, and reliability of their condition after the electrical signal is removed, can be improved in a manner not bound by the conventional technical principles.

Under the effect of an electrical signal or the like, vacancies will be formed in each resistive switching layer, and migrate and diffuse. There may be one or more resistive switching layers, and the numbers of migration interfaces and conductive layers will both increase or decrease with the number of resistive switching layers. Each resistive switching layer may have a thickness of from 0.5 nm to 20 nm. Each resistive switching layer may be formed of a material that may include a dielectric material. It may be, but is not limited to being, formed of one of $HfO_2$, $Ta_2O_5$, $TiO_2$, $ZrO_2$, $Al_2O_3$, $WO_3$, NiO and $Pr_{1-x}Ca_xMnO_3$, or a combination thereof. That is, the material of each resistive switching layer may be a single-phase or composite material such as a binary or multinary metal oxide.

Migration, diffusion and absorption of vacancies may occur at each migration interface. That is, vacancies in any resistive switching layer may be captured by, and migrate and diffuse, at a migration interface. The migration interfaces are physically and chemically defined as interfaces between adjacent layers, including geometric interfaces and intermediate compounds that may be formed between two phases.

Formation of the various layers in the RRAM and the integration thereof may be accomplished using well-known integrated circuit manufacturing processes.

For example, FIG. 1 shows the structure of an RRAM with two migration interfaces. This RRAM includes successively stacked two conductive layers and one resistive switching layer situated between the two conductive layers. Specifically, this RRAM with two migration interfaces includes a first conductive layer 101, a second conductive layer 102 and a first resistive switching layer 201 situated between the first conductive layer 101 and the second conductive layer 102. At a top interface between the first resistive switching layer 201 and the first conductive layer 101, there is formed a first migration interface 301. At a bottom interface between the first resistive switching layer 201 and the second conductive layer 102, there is formed a second migration interface 302.

Figure 2:
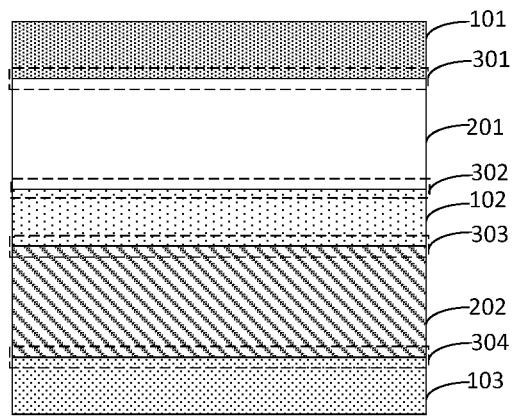
FIG. 2 is a schematic diagram showing the structure of an RRAM with four migration interfaces according to an embodiment of the present invention.

FIG. 2 shows the structure of an RRAM with four migration interfaces. This RRAM with four migration interfaces includes three conductive layers and two resistive switching layers. That is, the RRAM includes three successively stacked conductive layers and each of the resistive switching layers is situated between two adjacent conductive layers. Specifically, the RRAM with four migration interfaces includes a first conductive layer 101, a second conductive layer 102, and a third conductive layer 103, which are successively stacked, a first resistive switching layer 201 situated between the first conductive layer 101 and the second conductive layer 102, and a second resistive switching layer 202 situated between the second conductive layer 102 and the third conductive layer 103. At a top interface between the first resistive switching layer 201 and the first conductive layer 101, there is formed a first migration interface 301. At a bottom interface between the first resistive switching layer 201 and the second conductive layer 102, there is formed a second migration interface 302. At a top interface between the second resistive switching layer 202 and the second conductive layer 102, there is formed a third migration interface 303. At a bottom interface between the second resistive switching layer 202 and the third conductive layer 103, there is formed a fourth migration interface 304. Further, according to the present invention, RRAMs with six, eight or other numbers of migration interfaces are also possible.

Under the action of interface effects (i.e., physical or chemical effects of the migration interfaces, e.g., interface stress, chemical bonding, local charge interactions, etc.), vacancies can migrate into or out of a resistive switching layer under the action of an external stimulus (e.g., an electrical signal, temperature, or the like). For a system with multiple migration interfaces (e.g., two migration interfaces, four migration interfaces or other numbers of migration interfaces), when a vacancy is migrating in one direction, the migration interfaces on opposite sides of the resistive switching layer act differently on the vacancy.

Figure 3A:
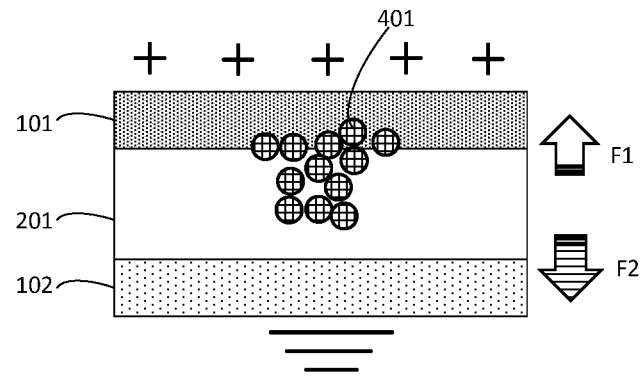
FIGS. 3a to 3c illustrate how an RRAM operates in accordance with an embodiment of the present invention.
Figure 3B:
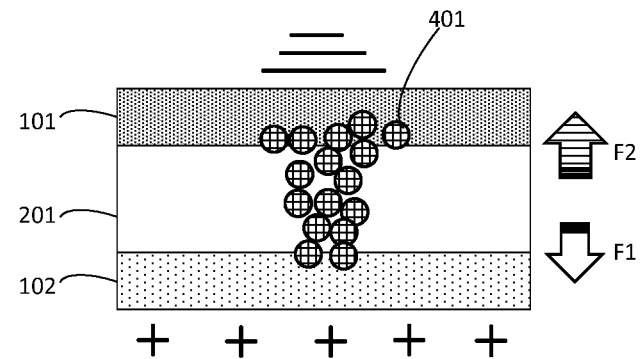
Figure 3C:
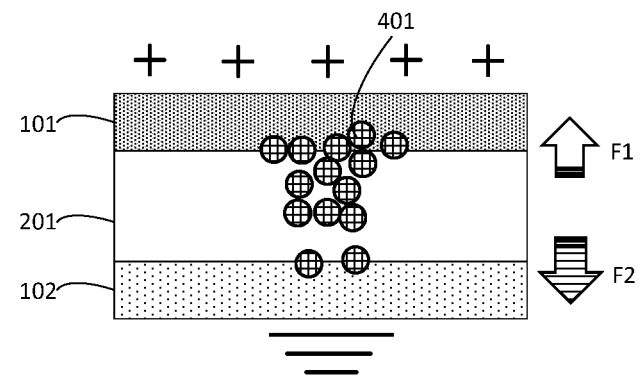

For example, reference is now made to FIGS. 3a to 3c, which show how the RRAM with two migration interfaces operates. For the operation of RRAMs with four, six or other numbers of migration interfaces, reference can be made to the operation of this RRAM with two migration interfaces.

Referring to FIG. 3a, the second migration interface 302 formed at the interface between the resistive switching layer 201 and the second conductive layer 102 have a stronger effect, compared to the first migration interface 301 formed at the interface between the resistive switching layer 201 and the first conductive layer 101. When an electrical signal acts on the first migration interface 301, vacancies (e.g., oxygen anions 401 or metal cations) in the vicinity of the first migration interface 301 will be driven by a force F1 exerted by the electrical signal (directed from the second migration interface 302 to the first migration interface 301) to migrate toward the first migration interface 301. At the same time, under an interface effect F2 of the second migration interface 302 (acting in the direction from the first migration interface 301 to the second migration interface 302), few vacancies will be produced near the second migration interface 302, and it is difficult for such vacancies to migrate to the second migration interface 302. As a result, the likelihood of the occurrence of an overshoot is effectively reduced.

Referring to FIG. 3b, when an electrical signal acts on the second migration interface 302, vacancies produced in the resistive switching layer 201 will be driven by a force F1 exerted by the electrical signal (directed from the first migration interface 301 to the second migration interface 302) to migrate toward the second migration interface 302. At the same time, under an interface effect F2 of the first migration interface 301 (acting in the direction from the second migration interface 302 to the first migration interface 301), vacancies will be effectively pulled and held without mitigating toward the second migration interface 302 and possibly causing an overshoot.

Referring to FIG. 3c, when an electrical signal again acts on the first migration interface 301, the weakest ones of vacancies in the resistive switching layer 201 will be filled, thus blocking the vacancy conduction path. The location of the weakest vacancies is subject to regulation by the composition of the multiple migration interfaces. Therefore, the RRAM with multiple migration interfaces also provides degrees of freedom of regulation in terms of morphology and polarity of the vacancy conduction path.

Therefore, the system with multiple migration interfaces in the present embodiment alters the positive feedback relationship between vacancy migration and the electrical signal, improving controllable migration of vacancies in the RRAM under the effect of the electrical signal and enhancing the ability of the vacancies to maintain their condition after the electrical signal is removed. Further, the combination of different migration interfaces also provides a degree of freedom of RRAM performance regulation, facilitating the design of memory devices for different applications.

In addition, the present invention also provides a method for operating the RRAM as defined above. The method includes the steps of:

S1: applying a first electrical signal to the resistive switching layer to increase or cause aggregation of vacancies; and S2: performing at least one cycle for vacancy regulation, each cycle including the steps of:

S21: applying a second electrical signal to the resistive switching layer to increase or cause re-aggregation of vacancies in the resistive switching layer, thereby allowing a formation or increase of conductive filaments in local regions of the resistive switching layer; and S22: applying a third electrical signal to the resistive switching layer to reduce vacancies, thereby allowing a break of the conductive filaments.

In the present embodiment, through properly choosing materials for the conductive and resistive switching layers, strength of the effects of the migration interfaces formed at the interfaces of the conductive and resistive switching layers (defined as binding strength of vacancies to a sub-stoichiometric material) can be regulated. In this embodiment, the conductive layers may be formed of sub-stoichiometric conductive materials, and the conductive layers in contact with opposite sides of one resistive switching layer may be formed of different materials. In this way, the migration interfaces formed on opposite sides of the resistive switching layer have different interface effects, and through the synergistic cooperation of the migration interfaces to regulate the vacancy. According to the present embodiment, the RRAM with migration interfaces having interface effects is effectively avoided from the occurrence of an overshoot during electrical formation. Study results show that devices tested at the limit currents of 100 μA and 1 mA for electrical formation did not exhibit significant differences in resistance states and permanent breakdown did not occur.

Step S1 accomplishes electrical formation, and in this step, applying the first electrical signal on the side of the resistive switching layer having a migration interface with a weaker interface effect can more effectively prevent overshooting. Of course, electrical formation can be also accomplished by applying the first electrical signal on the side of the resistive switching layer having a migration interface with a stronger interface effect, but the result is inferior to that of applying it on the side of the resistive switching layer having the migration interface with the weaker interface effect.

Immediately after the RRAM is manufactured, as there are few vacancies therein, it is in a very high resistance state. In the electrical formation process, the electrical signal applied ramps up until a critical level is reached. This increases vacancies and causes aggregation thereof, reducing the resistance. This electrical formation operation enables storage of data on RRAM cells and needs to be carried out only once.

Step S21 accomplishes a write operation, and in this step, applying the second electrical signal on the side of the resistive switching layer having the migration interface with the stronger interface effect can more easily result in the formation of a vacancy conduction path and effectively avoid overshooting. As a result of the application of the second electrical signal, the material of the resistive switching layer is brought into a low resistance state. Since the migration interfaces on opposite sides of the resistive switching layer have different interface effects, these migration interfaces can synergistically act to provide self-limitation, effectively preventing the occurrence of an overshoot during the write operation. Study results show that, in the write operation, the resistance does not always decreases with the increase of a voltage, and when the voltage rises to a high level, the resistance will become dynamic and exert a self-limiting effect on further continuation of the write operation.

Step S22 accomplishes an erase operation, and in this step, the third electrical signal is applied on the side of the resistive switching layer having a migration interface with the weaker interface effect. As a result of the application of the third electrical signal, the resistive switching layer is brought into a high resistance state. Study results show that an RRAM device according to the present embodiment did not show significant variation in both the high and low resistance states at 200 degrees Celsius within 168 hours. That is, the RRAM of this embodiment has highly desirable reliability.

RRAMs are grouped, according to the materials of which they are made, mainly into two categories: oxygen-anion-based RRAMs (oxide-based RRAMs, OxRAMs) and metal-cation-based RRAM.

Figure 4A:
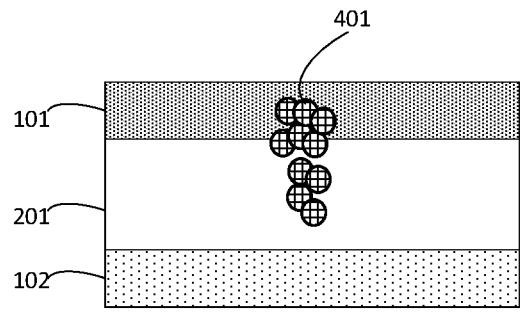
FIGS. 4a to 4c illustrate how an oxygen-anion-based RRAM operates under a switching mechanism combination according to an embodiment of the present invention.
Figure 4B:
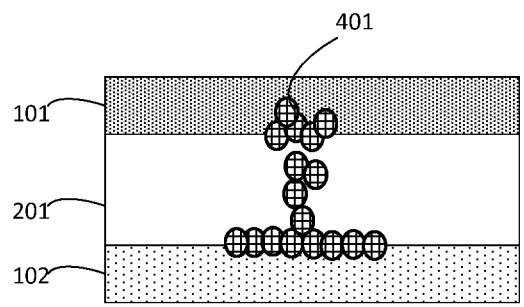
Figure 4C:
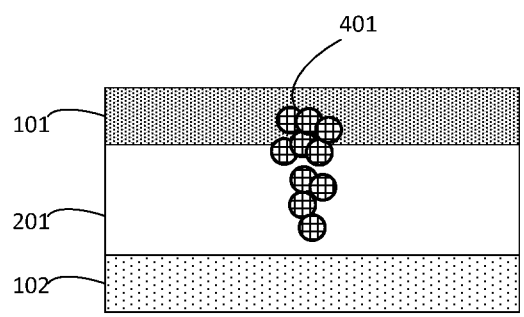
Figure 5A:
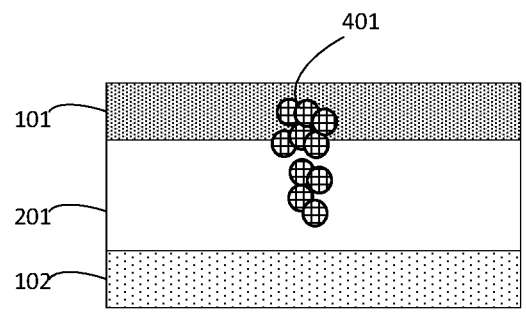
FIGS. 5a to 5c illustrate how an oxygen-anion-based RRAM operates under another switching mechanism combination according to an embodiment of the present invention.
Figure 5B:
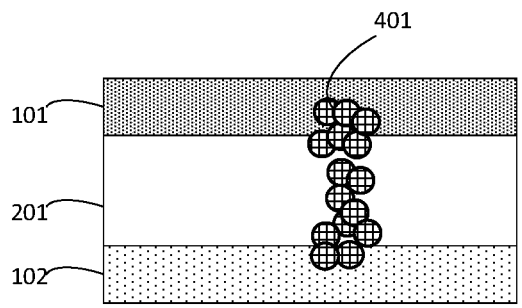
Figure 5C:
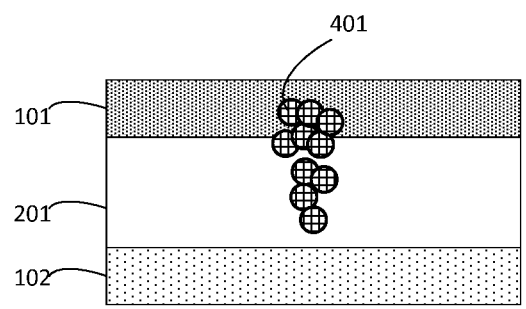

In oxygen-anion-based RRAMs, oxygen vacancies (or oxygen anion vacancies) are formed in a resistive switching layer. Oxygen-anion-based RRAMs are further grouped into the two sub-categories detailed below, depending on how resistive switching is achieved. One of the sub-categories is based on conductive filaments and an interface barrier change. Specifically, under the effect of an electric field, oxygen vacancies (or oxygen anions 401) aggregate toward an interface, where they experience electrochemical reactions which produce metal compounds. These metal compounds lead to a change in a Schottky barrier between the conductive layer and the resistive switching layer, achieving resistive switching, as shown in FIGS. 4a to 4c. The other of the sub-categories is based on conductive filaments and a conductive filament change. Specifically, as a result of migration of oxygen vacancies (or oxygen anions 401) under the effect of an electric field, they make up local conductive filaments each communicating with two conductive layers located vertically one above the other, thus achieving resistive switching, as shown in FIGS. 5a to 5c.

Operation of oxygen-anion-based RRAMs with multiple migration interfaces under different switching mechanism combinations is described below (in the context of oxygen-anion-based RRAMs with two migration interfaces, as an example).

FIG. 4a schematically illustrates the structure of an RRAM based on conductive filaments and an interface barrier change, which has experienced an electrical formation operation. When the first electrical signal is applied to the first migration interface 301, oxygen vacancies (or oxygen anions 401) aggregate toward the first migration interface 301 under the effect of an electric field. Since the second migration interface 302 does not form a conductive interface or have any conductive region, the system exhibits a relatively high resistance and hence a self-limiting effect on further continuation of the electrical formation operation. Moreover, due to the interface effect of the second migration interface 302, few vacancies will be produced near the second migration interface 302, and it is difficult for such vacancies to migrate to the first migration interface 301. Thus, the interface effect of the second migration interface 302 provides in-situ self-limitation, which additionally inhibits further continuation of the electrical formation operation and avoids the occurrence of permanent breakdown.

FIG. 4b schematically illustrates the structure of an RRAM based on conductive filaments and an interface barrier change, which has experienced a write operation. When the second electrical signal is applied to the second migration interface 302, oxygen vacancies (or oxygen anions 401) aggregate toward the second migration interface 302 under the effect of an electric field, thus forming or increasing conductive filaments. The aggregation of vacancies (i.e., oxygen vacancies or oxygen anions 401) at the migration interface on the opposite sides of the first resistive switching layer 201 will cause a change in a Schottky barrier between the conductive layer and the first resistive switching layer, between which the migration interface is formed. As a result, a switching of resistance takes place in the first resistive switching layer 201. That is, the first resistive switching layer 201 switches from a high resistance state to a low resistance state. Moreover, during this write operation, the first migration interface 301 will release some oxygen vacancies, which limit further continuation of the write operation, i.e., providing an in-situ self-limiting effect on further continuation of the write operation, thus preventing the occurrence of an overshoot.

FIG. 4c schematically illustrates the structure of an RRAM based on conductive filaments and an interface barrier change, which has experienced an erase operation. When the third electrical signal is applied to the first migration interface 301, the weakest ones of vacancies in the first resistive switching layer 201 will be filled, breaking the conductive filaments and thus blocking the vacancy conduction path. Meanwhile, under the effect of the third electrical signal applied to the first migration interface 301, vacancies that aggregate at at least one of the migration interfaces on opposite sides of the first resistive switching layer 201 migrate and are filled. For example, vacancies that aggregate at the second migration interface 302 migrate and are filled. This again leads to a change in a Schottky barrier between the conductive layer and the first resistive switching layer 201, between which the migration interface is formed, switching the first resistive switching layer 201 from a low resistance state to a high resistance state.

FIG. 5a schematically illustrates the structure of an RRAM based on conductive filaments and a conductive filament change, which has experienced an electrical formation operation. When the first electrical signal is applied to the first migration interface 301, oxygen vacancies (or oxygen anions 401) aggregate toward the first migration interface 301 under the effect of an electric field. Since the second migration interface 302 does not form a conductive interface or have any conductive region, the system exhibits a relatively high resistance. Due to the interface effect of the second migration interface 302, few vacancies will be produced near the second migration interface 302, and it is difficult for such vacancies to migrate to the first migration interface 301. Thus, the interface effect of the second migration interface 302 provides in-situ self-limitation, which inhibits further continuation of the electrical formation operation and avoids the occurrence of permanent breakdown.

FIG. 5b schematically illustrates the structure of an RRAM based on conductive filaments and a conductive filament change, which has experienced a write operation. When the second electrical signal is applied to the second migration interface 302, oxygen vacancies (or oxygen anions) aggregate toward the second migration interface 302 under the effect of an electric field, thus forming or increasing conductive filaments. As a result of the migration of oxygen vacancies (or oxygen anions 401) under the effect of the electric field, they make up local conductive filaments each communicating with the two conductive layers located vertically one above the other, thus causing a resistance state switching in the first resistive switching layer 201 from a high resistance state to a low resistance state. Moreover, during this write operation, the first migration interface 301 will release some oxygen vacancies, which limit further continuation of the write operation, i.e., providing an in-situ self-limiting effect on further continuation of the write operation, thus preventing the occurrence of an overshoot.

FIG. 5c schematically illustrates the structure of an RRAM based on conductive filaments and a conductive filament change, which has experienced an erase operation. When the third electrical signal is applied to the first migration interface 301, the weakest ones of vacancies in the first resistive switching layer 201 will be filled, breaking the conductive filaments and thus blocking the vacancy conduction path. As a result, the first resistive switching layer 201 switches from a low resistance state to a high resistance state.

Metal-cation-based RRAMs, i.e., conductive bridge RAMs (CBRAMs) utilize active metals as conductive layers. Under the effect of an electric field, each active electrode (i.e., conductive layer) will be electrochemically oxidized to produce metal cations 402, which, under the effect of the electric field, pass through a resistive switching layer and are then reduced and deposited on another conductive layer located on the other side of the resistive switching layer. As a result, metallic conductive filaments are formed, resulting in a resistance state switching.

In metal-cation-based RRAMs, vacancies formed in a resistive switching layer are metal cation vacancies. Operation of metal-cation-based RRAMs with multiple vacancy migration interfaces is described below (in the context of two interfaces as an example).

Figure 6A:
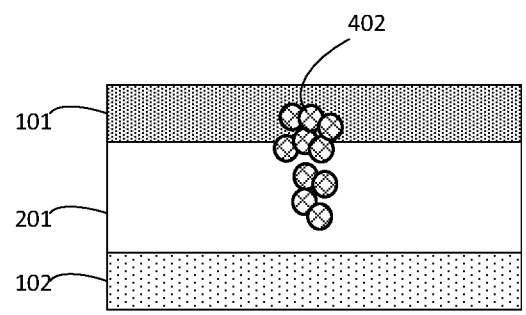
FIGS. 6a to 6c illustrate how a metal-cation-based RRAM operates in accordance with an embodiment of the present invention.

FIG. 6a schematically illustrates the structure of a metal-cation-based RRAM which has experienced an electrical formation operation. When the first electrical signal is applied to the second migration interface 302, under the effect of an electric field, the active electrodes (i.e., conductive layers) are electrochemically oxidized to produce metal cations 402, which migrate under the effect of the electric field. During this electrical formation operation, the interface effect of the second migration interface 302 will inhibit further migration of the metal cations 402. As a result, no conductive metallic filament will be formed, and the system exhibits a relatively high resistance and hence a self-limiting effect on further continuation of the electrical formation operation. Thus, the interface effect of the second migration interface 302 provides in-situ self-limitation, which inhibits further continuation of the electrical formation operation and avoids the occurrence of permanent breakdown.

Figure 6B:
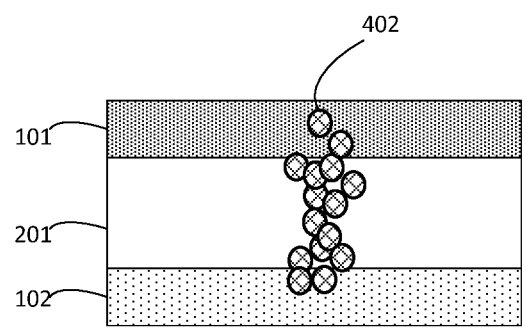

FIG. 6b schematically illustrates the structure of a metal-cation-based RRAM which has experienced a write operation. When the second electrical signal is applied to the first migration interface 301, metal cations 402 aggregate toward the second migration interface 302 under the effect of an electric field, resulting in the formation of metallic filaments (i.e., conductive filaments). During this write operation, at a high level of the electrical signal, the first migration interface 301 will create a smaller number of metallic filaments, thus limiting further continuation of the write operation. That is, an in-situ self-limiting effect is provided on further continuation of the write operation, avoiding the occurrence of an overshoot.

Figure 6C:
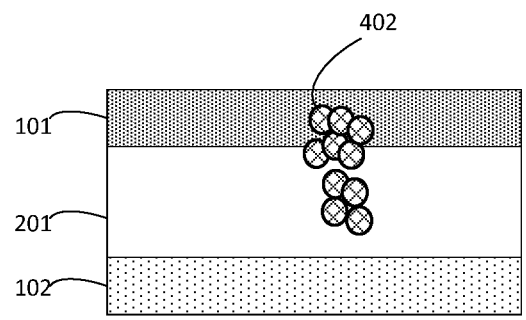

FIG. 6c schematically illustrates the structure of a metal-cation-based RRAM which has experienced an erase operation. When the third electrical signal is applied to the second migration interface 302, the weakest ones of vacancies in the first resistive switching layer 201 will be filled, breaking the conductive filaments and thus blocking the vacancy conduction path.

In summary, in these embodiments, the multiple migration interfaces work in combination to provide a synergistic action, which exerts an in-situ self-limiting effect on migration of vacancies under the effect of an electrical signal, allowing stable, reliable read, write, and erase operations.

According to the present invention, through providing migration interfaces with interface effects at interfaces of conductive and resistive switching layers, and by virtue of a synergistic action of the multiple migration interfaces, during RRAM operation, more stable and controllable migration of vacancies and more stable and reliable existence of vacancies in a resistive switching layer can be achieved. Thus, the problem of controllable migration of vacancies in RRAMs under the effect of an electrical signal, and the problem of reliability of the condition of vacancies after the electrical signal is removed, are solved in a manner not bound by the conventional technical principles.

Additionally, it is to be understood that, while the disclosed technology has been described with reference to several embodiments, the forgoing embodiments are not intended to limit the invention. In light of the teachings hereinabove, any person familiar with the art may make various possible variations and changes to the disclosed embodiments or modify them into equivalent alternatives, without departing from the scope thereof. Accordingly, any and all such simple variations, equivalent alternatives, and modifications made to the foregoing embodiments without departing from the scope of the invention are intended to fall within the scope thereof.

It is to be further understood that the present invention is not limited to the particular methodology, compounds, materials, fabrication techniques, uses and applications described herein, as these may vary. It is also to be understood that the terminology used herein is for the purpose of describing particular embodiments only, and is not intended to limit the scope of the present invention. It must be noted that as used herein and in the appended claims, the singular forms "a", "an" and "the" include the plural reference unless the context clearly dictates otherwise. Thus, for example, a reference to "a step" is a reference to one or more steps and may include sub-steps. All conjunctions used are to be understood in the most inclusive sense possible. Thus, the term "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

What is claimed is:

1. A method for operating a resistive random access memory (RRAM), wherein the RRAM comprises at least two successively stacked conductive layers and a resistive switching layer situated between every adjacent two conductive layers, wherein a migration interface with an interface effect is formed at each interface between one conductive layer and the resistive switching layer in contact therewith, wherein the migration interface regulates, by the interface effect, vacancies formed in the resistive switching layer under an effect of an electrical signal, wherein the regulation comprises at least one of absorption, migration and diffusion, and wherein the method comprises the steps of:
applying a first electrical signal to the resistive switching layer to increase or to aggregate vacancies; and performing at least one cycle to regulate the vacancies, wherein each cycle comprises:
applying a second electrical signal to the resistive switching layer to increase or to re-aggregate the vacancies in the resistive switching layer, thereby allowing a formation or an increase of conductive filament(s) in a local region of the resistive switching layer; and
applying a third electrical signal to the resistive switching layer to reduce the vacancies, resulting in a break of the conductive filament(s).

2. The method of claim 1, wherein the conductive layer is formed of a material comprising one of a single-phase conductive material or a composite conductive material.

3. The method of claim 2, wherein the material of the conductive layer comprises a sub-stoichiometric conductive material.

4. The method of claim 3, wherein the material of the conductive layer comprises one of a sub-stoichiometric metal oxide, a sub-stoichiometric metal nitride, a sub-stoichiometric metal sulfide, a sub-stoichiometric metal phosphatide, a sub-stoichiometric metal selenide, a sub-stoichiometric metal arsenide, a sub-stoichiometric metal telluride and a sub-stoichiometric antimonide, or a combination thereof.

5. The method of claim 1, wherein the conductive layers in contact with opposite sides of one resistive switching layer are formed of different materials so that the migration interfaces formed on the opposite sides of the resistive switching layer have different interface effects.

6. The method of claim 1, wherein the resistive switching layer is formed of a material comprising at least one of a binary metal oxide or a multinary metal oxide.

7. The method of claim 6, wherein the material of the resistive switching layer comprises one of $HfO_2$, $Ta_2O_5$, $TiO_2$, $ZrO_2$, $Al_2O_3$, $WO_3$, $NiO$, or $Pr_{1-x}Ca_xMnO_3$, or a combination thereof.

8. The method of claim 1, wherein the resistive switching layer has a thickness of from 0.5 nm to 20 nm.

9. The method of claim 1, wherein the RRAM is an oxygen-anion-based RRAM and the vacancies in the resistive switching layer are oxygen anion vacancies; or wherein the RRAM is a metal-cation-based RRAM and the vacancies in the resistive switching layer are metal cation vacancies.

10. The method of claim 1, wherein when the migration interfaces formed on opposite sides of the resistive switching layer have different interface effects, the regulation of the vacancies is accomplished by a synergistic action of the migration interfaces formed on the opposite sides of the resistive switching layer.

11. The method of claim 10, wherein the first electrical signal is applied on a side of the resistive switching layer having a migration interface with a weaker interface effect.

12. The method of claim 10, wherein the first electrical signal is applied on a side of the resistive switching layer having a migration interface with a stronger interface effect.

13. The method of claim 10, wherein the second electrical signal is applied on a side of the resistive switching layer having a migration interface with a stronger interface effect.

14. The method of claim 10, wherein the third electrical signal is applied on a side of the resistive switching layer having a migration interface with a weaker interface effect.

15. The method of claim 1, wherein when the second electrical signal is applied to the resistive switching layer, the vacancies aggregate at the migration interfaces on opposite sides of the resistive switching layer, to cause a change in Schottky barriers between the conductive layers and the resistive switching layer, between which the migration interfaces are formed, thereby changing a resistance state in the resistive switching layer; and wherein when the third electrical signal is applied to the resistive switching layer, the vacancies located at at least one of the migration interfaces on opposite sides of the resistive switching layer migrate and are filled, to cause another change in the Schottky barriers between the conductive layers and the resistive switching layer, between which the migration interfaces are formed.

16. The method of claim 1, wherein the second electrical signal is applied to enable the resistive switching layer to be at a low resistance state, and wherein the third electrical signal is applied to enable the resistive switching layer to be at a high resistance state.

* * * * *